United States Patent [19]

Inden et al.

[11] Patent Number: 4,905,165
[45] Date of Patent: Feb. 27, 1990

[54] MEASURED DATA DISPLAY DEVICE WITH STRIP CHART SIMULATION AND TABLE FORMAT

[75] Inventors: Toshikazu Inden, Fujioka; Hideki Negishi, Takasaki; Koudou Hara, Kumagaya; Takayuki Kanzawa, Takasaki, all of Japan

[73] Assignee: Chino Corporation, Tokyo, Japan

[21] Appl. No.: 87,475

[22] Filed: Aug. 20, 1987

[30] Foreign Application Priority Data

Aug. 20, 1986 [JP] Japan .................. 61-192737
Aug. 20, 1986 [JP] Japan .................. 61-192738

[51] Int. Cl.[4] .............................. G09G 1/00
[52] U.S. Cl. .................. 364/518; 340/715; 340/747; 340/748; 346/33 ME
[58] Field of Search .......... 340/715, 722, 721, 747, 340/748, 723, 746; 364/518, 520, 521; 346/33 ME

[56] References Cited

U.S. PATENT DOCUMENTS

| | | | |
|---|---|---|---|
| 4,001,807 | 1/1977 | Dallimonti | 340/722 |
| 4,231,032 | 10/1980 | Hara et al. | 340/747 |
| 4,272,767 | 6/1981 | Lacy | 340/747 |
| 4,364,036 | 12/1982 | Shimizu | 340/721 |
| 4,586,036 | 4/1986 | Thomason et al. | 340/747 |
| 4,661,720 | 4/1987 | Cameron, Jr. et al. | 307/117 |

FOREIGN PATENT DOCUMENTS

| | | | |
|---|---|---|---|
| 58-90120 | 5/1983 | Japan | 340/747 |
| 60-107109 | 6/1985 | Japan | 340/722 |

*Primary Examiner*—William M. Shoop, Jr.
*Assistant Examiner*—Howard L. Williams
*Attorney, Agent, or Firm*—Kanesaka and Takeuchi

[57] ABSTRACT

This invention displays a screen simulating a pen drawing measured data on a recording paper when displaying the measured data on the screen.

For this purpose, this invention displays the measured data on the screen by composing the content in a video memory holding the screen information similar to a recording paper and the content in a data memory storing the measured data.

6 Claims, 16 Drawing Sheets

| Time | CH1 | CH2 | — | CH11 | CH12 |
|---|---|---|---|---|---|
| 13:06 | 223.1 | — | | — | — |
| 13:04 | 217.5 | — | | — | — |
| 13:02 | 212.2 | — | | — | — |
| ⋮ | ⋮ | ⋮ | ⋮ | ⋮ | ⋮ |
| 12:12 | 110.1 | — | | — | — |
| 12:10 | 105.0 | — | | — | — |

FIG. 8
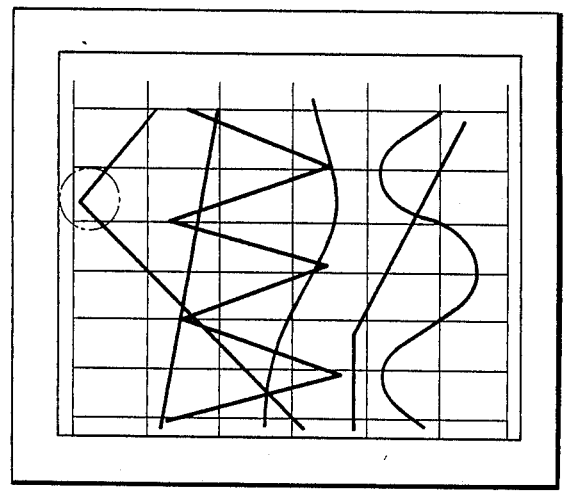
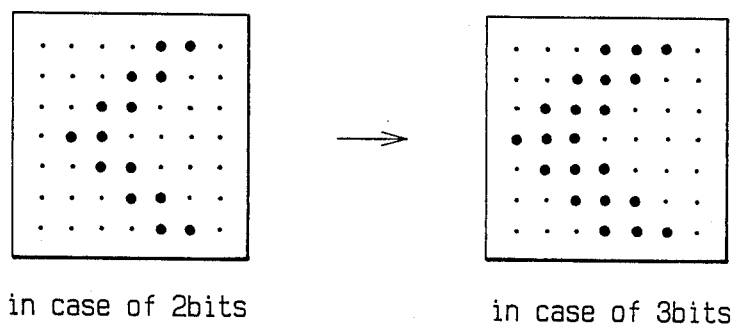
in case of 2bits      in case of 3bits

FIG. 9
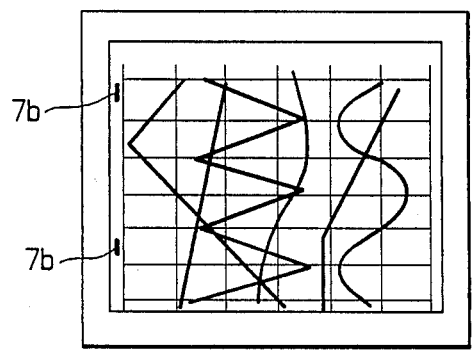
FIG. 10
(A) 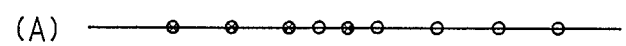
(B) 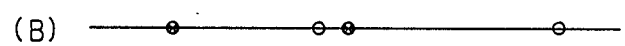
(C) 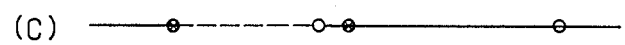

FIG. 14

```
DATE    1986. 1.14                          DOT INT. 30 SEC
TIME    18:25              LOT No 85X234   FULL TIME I8 MIN
 CH   INPUT   RANGE          SCALE   UNIT   CJ   L.AL   H.AL
  1     R      0~1700        0~1700    °C   INT   1200   1500
  2     R      0~1700        0~1700    °C   INT   1200   1500
  3     R      0~1200        0~1200    °C   INT   1000   1100
  4     R      0~1200        0~1200    °C   EXT   1000   1100
  5     K      0~ 300        0~ 300    °C   INT     80    250
  6     K      0~ 300        0~ 300    °C   INT    -80    250
  7     K   -100~ 600     -100~ 600    °C   INT    -20    580
  8     K   -100~ 600     -100~ 600    °C   EXT    -20    580
  9     K      0~1200■       0~1200    °C   EXT    750    920
 10     E    -50~ 300      -50~ 300    °C   INT    -30    240
 11     E    -50~ 300      -50~ 300    °C   INT    -30    240
 12     E      0~ 800        0~ 800    °C   EXT    550    720
```
7a
7b

FIG. 15

```
DATE    1986. 1.14                          DOT INT. 30 SEC
TIME    18:25              LOT No 85X234   FULL TIME I8 MIN
 CH   INPUT   RANGE          SCALE   UNIT   CJ   L.AL   H.AL
  1     R      0~1700        0~1700    °C   INT   1200   1500
  2     R      0~1700        0~1700    °C   INT   1200   1500
  3     R      0~1200        0~1200    °C   INT   1000   1100
  4     R      0~1200        0~1200    °C   EXT   1000   1100
  5     K      0~ 300        0~ 300    °C   INT     80    250
  6     K      0~ 300        0~ 300    °C   INT    -80    250
  7     K   -100~ 600     -100~ 600    °C   INT    -20    580
  8     K   -100~ 600     -100~ 600    °C   EXT    -20    580
  9     K      0~1200■       0~1200    °C   EXT    750    920
 10     E    -50~ 300      -50~ 300    °C   INT    -30    240
 11     E    -50~ 300      -50~ 300    °C   INT    -30    240
 12     E      0~ 800        0~ 800    °C   EXT    550    720
```
7a
7b  7d

MEASURED DATA DISPLAY DEVICE WITH STRIP CHART SIMULATION AND TABLE FORMAT

BACKGROUND OF THE INVENTION

1. Field of the Invention:

This invention relates to a measuring instrument that processes the measured result for display on a screen, more specifically to such a measuring instrument that improves the displaying method of the measured data to be displayed on the screen.

2. Description of the Prior Art

A conventional measuring instrument is disclosed in Japanese Patent Kokai No. 60-46416 as one example of an instrument that converts measured signals of analog data detected at plural locations and processes the converted signals for display on the screen.

FIG. 20 shows the construction of the measuring instrument mentioned above in which measured signals I1, I2, . . . In are input in order into an A/D converter (12) by a multiplexer and input into a CPU (13) as digital signals converted by the A/D converter (12). The CPU (13) displays the digital signals on the screen by processing under consideration of the condition of parameters input from set value input section (18), scale, displaying speed and so on.

The meanings and functions of an image memory (14) connected to the CPU (13) through data lines and address lines, a CRT (15), a data memory (16) and hard copy (17) are not described here since they are well known as the peripheral equipment of ordinary computers.

The display format of the measured data to be displayed on the screen is shown in FIG. 21, in which the X and Y axes indicate the time and physical values. The above display format is very different, however, from that of the existing measuring instrument that uses ink pens and chart paper, so that it is difficult for people familiar with the existing measuring instrument to understand the measured data. In such a display format, the screen overflows every predetermined time and is cleared, so that there is a problem that the data just after clearing the screen is not compared with the data just before clearing the screen.

SUMMARY OF THE INVENTION

The first object of the invention is to recognize the measured data with the same feel as existing measuring instruments by displaying the measured data on the screen as if it is drawn on the recording paper with a pen.

The second object of the invention is not to clear the screen every prescribed time, so that the present measured data can be always compared with the past measured data.

The third object of the invention is to enable easy understanding of the measured data on the screen.

The fourth object of the invention is to use effectively a measuring instrument displaying the measured data on the screen.

Other objects, features, and advantages of the invention will be apparent from the following description taken in conjunction with the accompanying drawings.

BRIEF DESCRIPTION OF THE DRAWINGS

FIG. 8 is a view showing a differential dot size of the trend format on the screen.

FIG. 9 is a pictorial view of the screen with information showing an accident.

FIG. 10 is a view showing differences on screen reproduced by a measured data display controlling section.

FIG. 14 through FIG. 17(a) and 17(b) are screen views expressing the setting method of measuring condition setting parameters.

DESCRIPTION OF THE PREFERRED EMBODIMENTS

A preferred embodiment of the present invention will now be described with reference to the drawings.

Figure 1:
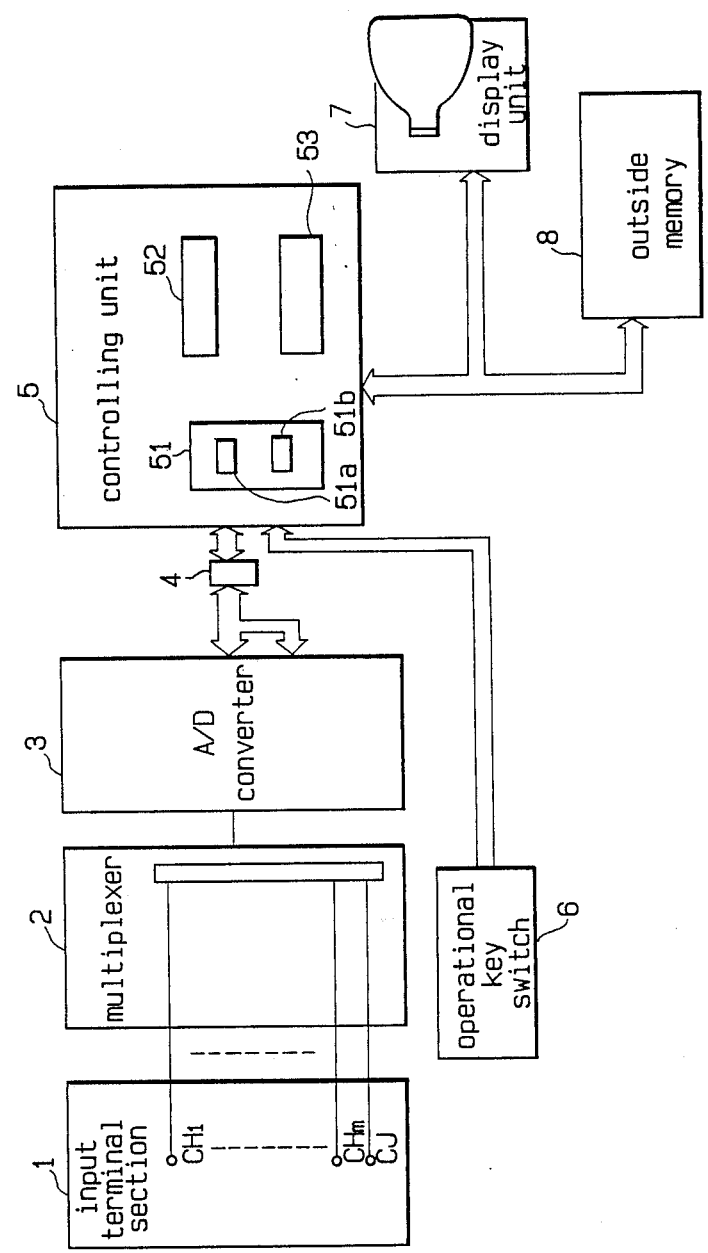
FIG. 1 is a block diagram of a system embodying the present invention.

FIG. 1 is a block diagram of the display unit of the invention, in which (1) is an input terminal section having plural channels CH1 through CHm accepting measured analog signals of the temperature, the flow or the pressure, etc., (2) is a multiplexer in the form of an input selecting switch for selecting one of the input signals input into the input terminal section, and outputting the selected signal, (3) is an A/D converter that converts measured analog signals of each of the channels CH1 through CHm output from the multiplexer (2) in order into digital signals by a sequential method (when at low speed) or by a synchronous method (when at high speed), (4) is an isolation means isolating the digital measured signals converted by the A/D converter (3) and output therefrom, (5) is a controlling unit operating on the measured data isolated by the isolation means to display the same display format on the screen as trend format drawn on a paper moved at constant speed with pen, and controlling the memory operation of measured data to be stored in an external memory, (6) is an operational key switch to externally operate the controlling unit, (7) is a display unit displaying the same conditions as the trend format according to the measured data, (8)

is an external memory for storing the result of the operation on the measured data.

In the above, the controlling unit (5) is provided with a trend format display controlling section (51) for displaying the same condition on the screen of the display unit (7) as trend format drawn on a moving paper with a pen. This is obtained by the operation of measured data of digital signals, a table format display controlling section (52) for displaying the table format which is drawn as digital numerals of measured data at every instant, and a switching section (53) for switching the display by the trend format display controlling section (51) and the display by the table format display controlling section (52).

In operation, when measured analog signals of the temperature, the flow, the pressure, etc., are input into the plural channels CH1 through CHm of the input terminal section (1), the multiplexer (2) selects the measured analog signals input into the plural channels CH1 through CHm of the input terminal section (1) to output the analog signals in order to the A/D converter (3). Thus the measured signal input into channel CH3 follows the measured signal input into channel CH2, which follows the measured analog signal input into channel CH1.

The A/D converter (3) converts the measured analog signals output from the multiplexer (2) into digital signals and outputs the converted digital signals to the isolation means (4), which isolates the converted digital signals and applies them to the controlling unit (5).

The controlling unit (5) linearizes the converted digital signals of measured data and performs the required operation to display the same condition on the screen as the trend display drawn on the paper moved at constant speed with a moving pen.

The operation of the controlling unit (5) will now be explained in detail.

Figure 2:
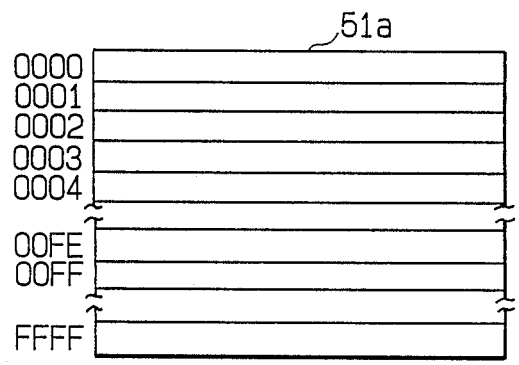
FIG. 2 is a map of the video memory.

FIG. 2 is a general view showing the construction of a video memory (51a) in the display controlling section (51) of the controlling unit (5), in which the video memory (51a), for example, has storage area indicated by addresses OOOOOO through FFFFFF.

The storage area indicated by one address takes charge of the image part of one scanning line when scanning the display screen of the display unit (7) and the storage area indicated by addresses OOOOOO through OOOOFF can store the image of one screen display on the display unit (7), namely, scanning lines of FF construct one screen portion.

The trend display controlling section (51) accesses the image information memorized in the storage area pointed to by address of OOOOOO through OOFFFF sequentially and scans the screen of the display unit (7) based on the order of accessed address to produce the image of one screen and then accesses the storage area pointed by addresses FFFFOO through FFFFFF and OOOOFF through OOFFFF sequentially to produce a following image of one screen for display. At this time, the information is displayed at the location corresponding to the location of a pen on a recording paper so that the measured data simulating that drawn on the recording paper with the pen is stored in the storage pointed by addresses FFFFOO through FFFFFF, while the image of one screen part is produced by accessing the storage area of addresses OOOOOO through OOFFFF.

When the stored information composed with the video memory (51a) is displayed, the trend format is displayed on the screen in the manner of the pen drawing the measured data on the recording paper moving at designated speed.

Figures 3, 4:
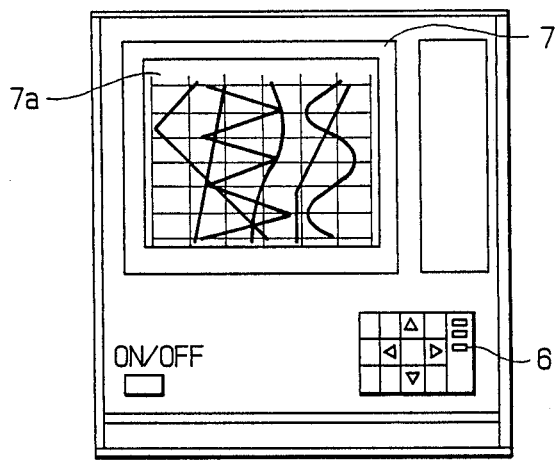
FIG. 3 is a view showing the trend format on the screen.
FIG. 4 is a view showing an example of the display format displayed by a table format controlling section.

FIG. 3 shows the trend format displayed on the screen.

As shown in FIG. 3, the screen is scanned from the top to the bottom sequentially and the dots in correspondence with the new measured data appear from the top of the screen at regular intervals in the manner of movement of the recording paper with the divisions.

The table format display controlling section (52) in the controlling unit (5) processes the measured data and displays each of the processed data at each time on the screen in the table format digital numerals. Namely, as shown in FIG. 4, the matrix table constructed by designated frames is used to contain the measured data output from each of the channels at each of the times as digital numerals. In the table, the rows and columns depict each channel and each time respectively.

Thus, the measured data contained in the matrix table is displayed on the screen. The screen switching section (53) in the controlling unit (5) controls switching, to display measured data on the screen in the trend format by the trend format display controlling section (51) or to display measured data in the table format by the table format display controlling section (52).

The switching operation is performed by the operator who operates the operational key switch (6). Thus, the trend format is controlled by the trend format display controlling section (51).

The measured data are recognized in the same sense as the conventional recording paper so that the operator does not feel a sense of incompatibility, and in the table format controlled by the table format display controlling section (52), the change of measured data from the past to the present can be recognized in every one of the channels the user can select, whether the trend format or the table format. As a result, the measured data can be recognized in response to the purpose for which it is to be used.

Next, an explanation will be given of a mode of another embodiment.

Figure 5:
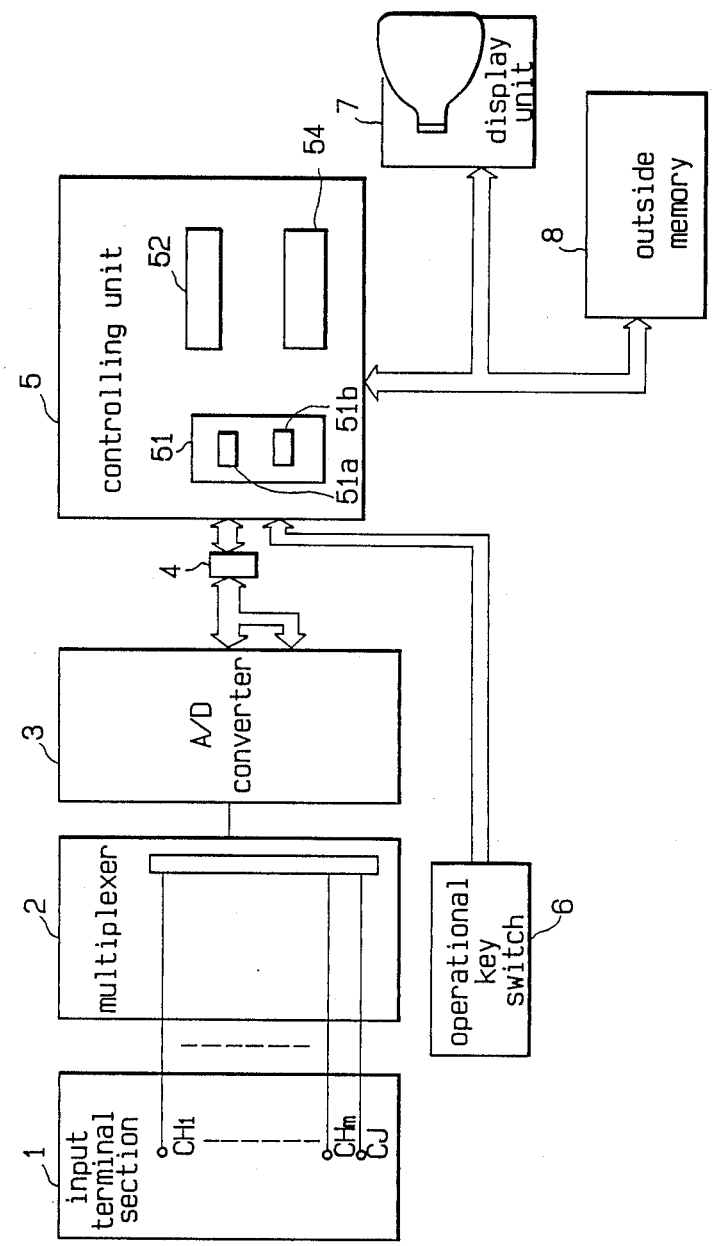
FIG. 5 is another block diagram of a system embodying the present invention.

FIG. 5 is a block diagram showing another embodiment of the invention, in which (54) is a display screen controlling section which controls the cursor that is moved to point to the measured data at a specific time when the screen is displayed by the trend format display controlling section and which controls the table format display controlling section to display the measured data at the above specific time on the screen in table format.

The other elements are the same as those shown in FIG. 1 so the explanation is abbreviated by giving these elements the same numbers.

Figure 6:
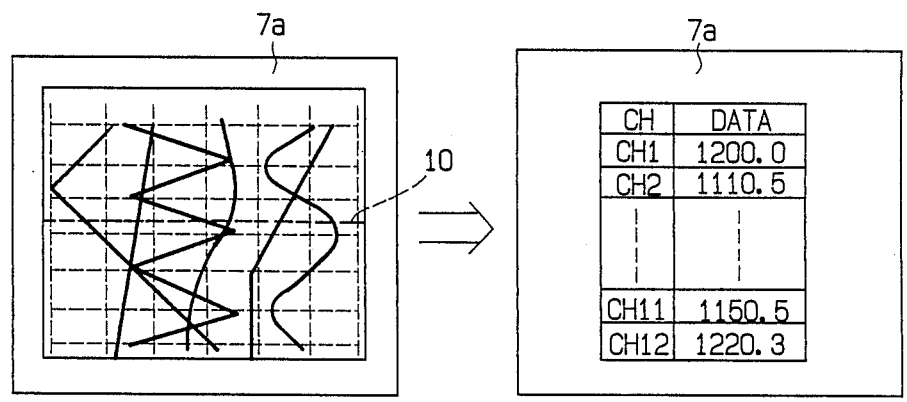
FIG. 6 is a view showing an example of changing the table format from the trend format.

FIG. 6 is a view showing a example of the trend format changing to the table format in correspondence with the place of the cursor.

As shown in FIG. 6, when the trend format is displayed on the screen by the trend format display controlling section (51) and the user wishes to view the measured data at a specific time by moving the cursor displayed on the screen, the display screen controlling section (54) displays the measured data at the specific time on the screen in the table format according to the place of the cursor on the screen.

Figure 7:
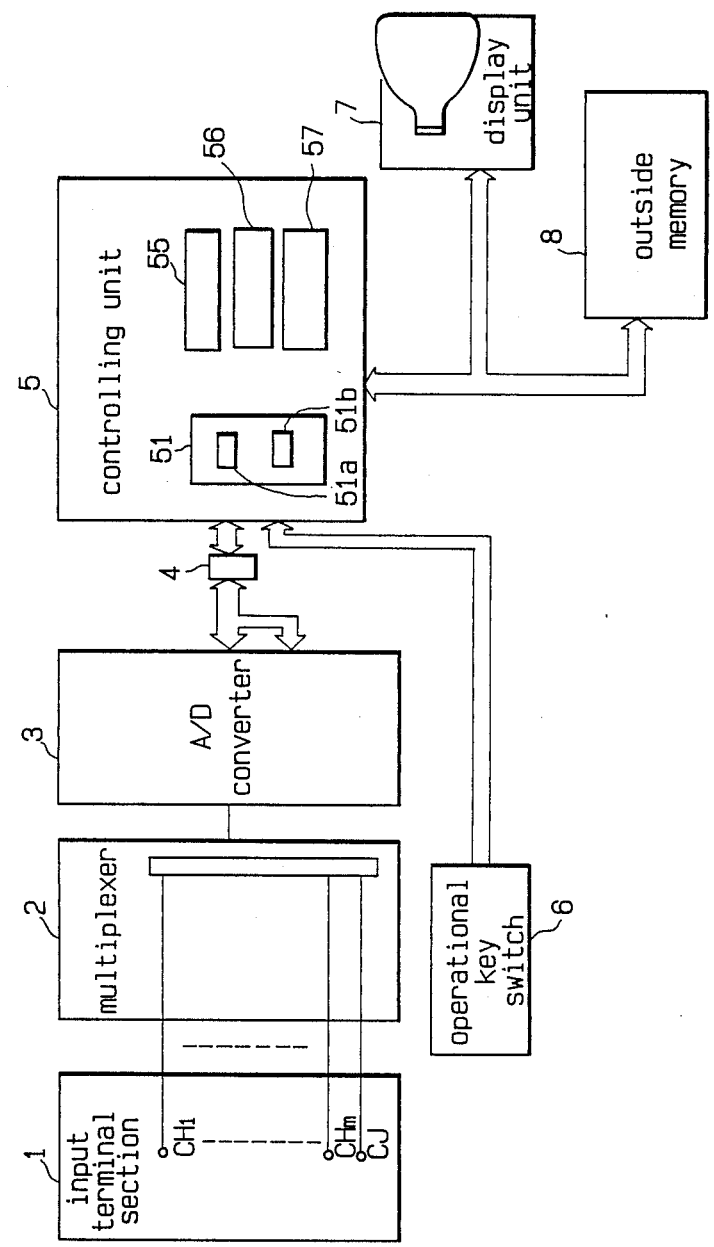
FIG. 7 is a block diagram showing another embodiment of the invention.

An explanation will now be given of another embodiment of the invention. FIG. 7 is a block diagram showing another embodiment of the invention. As shown in FIG. 7, controlling unit (5) is provided with a changing section (55) which changes the size of dots displayed when the trend format display controlling section (51) displays the trend format on the screen, abnormal information adding section (56) which detects the abnormal conditions of the measured data when the trend format is displayed on the screen by the trend format display controlling section (51) and displays the abnormal information in addition to the measured data displayed in the trend format, and a measured data reproduction displaying controlling section (57) which stores the maximum measured data and the minimum measured data out of the measured data in case that the recording speed is so low that the plural dots are displayed on one line and draws a line from the maximum measured data to the minimum measured data when reproducing the trend format on the screen.

In operation, the changing section (55) changes the size of dots according to the selection thereof made by the user and the trend format display controlling section (51) displays the dots at a place on the screen that is a function of the measured data. In FIG. 8, the two lower views are enlargements of the upper view.

Namely, as shown in the lower left hand view of FIG. 8, depicting normal time, two enlarged dots displayed on the screen depict the width of a display line, but when the user operates the operational key switch (6), the changing section (55) changes the number of enlarged dots to three dots. When the size of dots is changed, the line displayed in the trend format is easy to view when the user watches the screen from a distance.

The abnormal information adding section (56) detects whether the measured data is normal, that is, between the upper value and the lower value or is abnormal, that is, outside the upper value or the lower value, and displays the occurrence of abnormal information to give an alarm when an abnormal condition has been detected.

The abnormal information condition is displayed, as shown in FIG. 9, by displaying a red line at the left side when the measured data is abnormal. In this case, a variation in the method, such as changing a color of the line of the trend format or changing the line into a dotted line, may be considered.

In the present invention, horizontal lines on a screen of the display unit (7) changes as time passes by. Namely, one horizontal line represents a predetermined period of time. In case a plurality of data is measured in a predetermined period of time represented by one horizontal line, a plurality of measured data is displayed on one line as dots.

The measured data reproduction display controlling section (57) calculates locations of the dots that represent the maximum value and the minimum value out of a large number of dots arranged on one line. In other words, section 57 calculates the measured data and picks up the maximum and minimum values out of measured data displayed on the same line as dots when the speed of the display which is displayed by the trend format display controlling section (51) is so low that a plurality of dots is displayed on the same line. In other words, when the time intervals of the measured data are short, section 57 stores minimum values and the minimum of the measured data arranged on the same line in the outside memory (8).

A line is drawn from the point of the maximum data to the point of the minimum data and is displayed when reproducing the measured data stored in the outside memory (8) on the screen (7a) of the display unit (7).

FIG. 10 shows an example of the trend format on the screen reproduced by the controlling section (57).

In FIG. 10(A), a plurality of data is displayed as dots on one line, which represent two channels. In FIG. 10(B), in each channel, maximum and minimum values are only shown on one line. In FIG. 10(C), at a left side channel, the maximum and minimum values are connected by a chain line, while at a right side channel, the maximum and minimum values are connected by a solid line. A portion overlapped by the two channels is shown by a solid line.

As is shown in FIGS. 10(a–c), the trend format reproduced after memorizing is scarcely different from the trend format before memorizing, although there are a few differences. Even if the line is drawn between two measured data which represent the maximum and minimum values, the recognition of the measured data is not changed because the line shows the range of change of the measured data in the same time.

Next, an explanation will be given of another embodiment of the invention.

Figure 11:
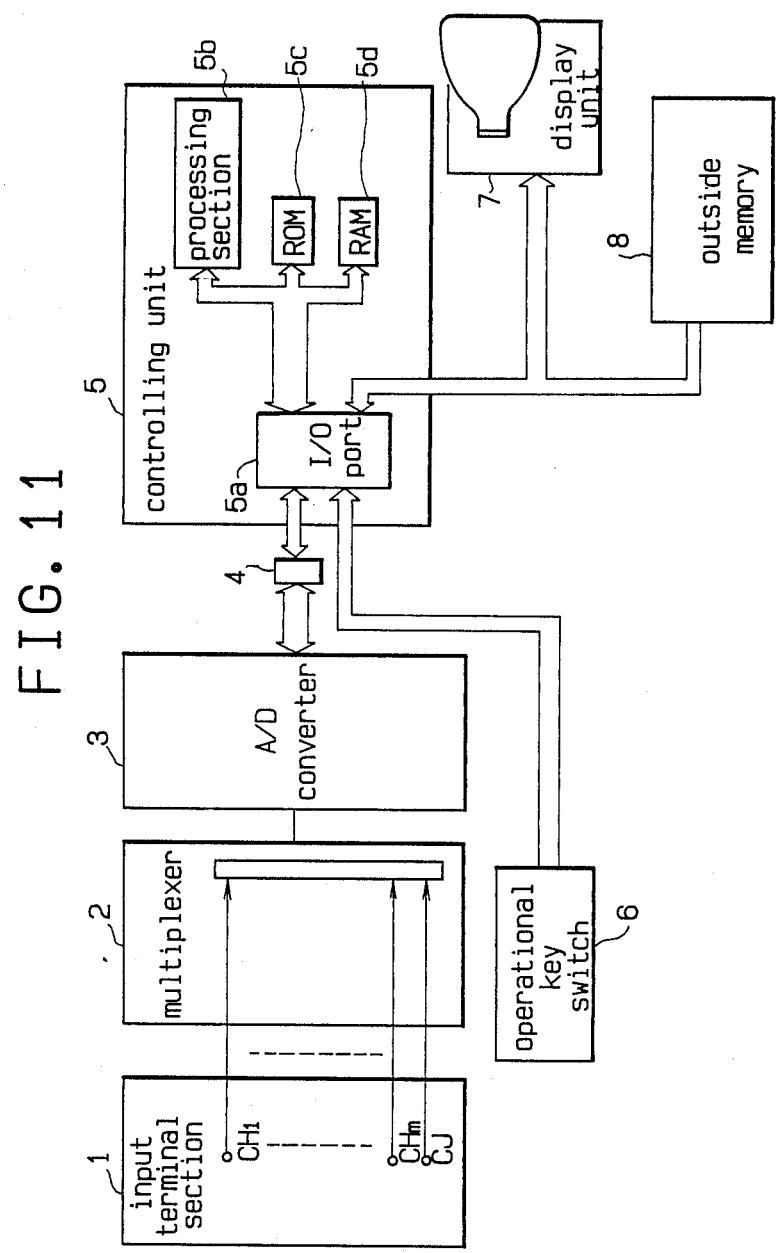
FIG. 11 is a block diagram of a measuring instrument of the embodiment of the invention.
Figure 12:
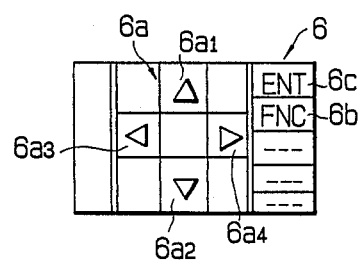
FIG. 12 is a view of the operational key switch of the above measuring instrument.

FIG. 11 is a block diagram of another embodiment of the invention. As shown in FIG. 11, the controlling section (5) has a processing section (5b) that processes the measured data of the digital format coming through a I/O port (5a) and displays the measured data in the designated table format according to the operational signals input from the operational key switch (6) on the display unit (7), a ROM (5c) which memorizes programs and the like for processing of the processing section (5b) and a memorizing means such as a RAM (5d) that memorizes the processed data. The above memorizing means stores tables such as plural parameters of previous measuring conditions.

The operational key switch (6) has cursor keys (6a) for operating the cursor to move right and left or up and down on the screen (7a) of the CRT (for example, top key (6a1), bottom key (6a2), left key (6a3), right key (6a4) ) FNC key (6b) and ENT key (6c) which display various kinds of parameters of measuring conditions and the like on the screen (7a) and sets the parameters pointed by the cursor and so on.

Figure 13:
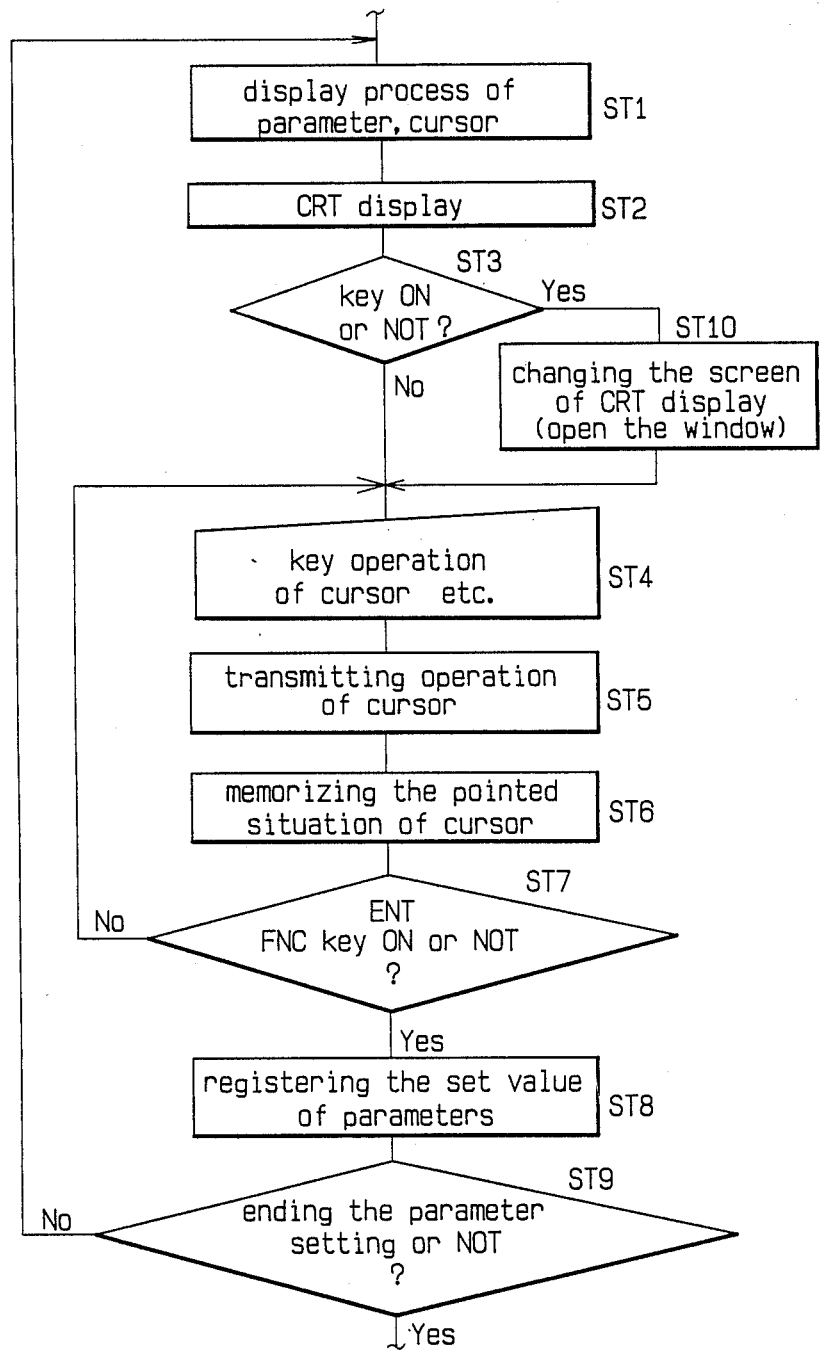
FIG. 13 is a flow chart showing the set operation of measuring condition setting parameters.

Now, an explanation will be given of the action of setting parameters that are set in response to the measured value input from each of channels in reference to the flow chart of FIG. 13. At first, the controlling unit performs the initial setting. In this initial setting, when the parameters of the measuring conditions are ready for setting, the following process is done.

The process of displaying the parameters and the cursor for displaying the mode of parameters of the measured conditions and the cursor for pointing its mode in each of channels is performed (step ST1). The processed data is memorized in the image memory. The CRT display, for example, as shown in FIG. 14, is performed according to the data memorized in the image memory and so on (step ST2).

In FIG. 14, the parameters that are set and registered already and so on is displayed.

In the above, in case of setting parameters of the measured conditions, each of the channels operating the cursor key (6a) processes the moving of the cursor (7b) according to the operation of the cursor key (6a) and moves the cursor (7b). For example, at this time, the setting mode for setting the range of the scale axes of channel (CH)9 is stored at the designated place in the RAM (5d).

The above action is repeated as long as the ENT key (6c) is ON and the pointed situation of the cursor 7b (this situation is adapted to each table of the measure condition parameters) is memorized at the designated position of the RAM (5d) every time.

Thus, when the ON operation of the ENT key (6c) after pointing the kind of channels and parameters is performed, the parameter (table) of the range of scale axes that is adapted to the above memorized position (as pointed to by the cursor (7b)) is displayed at the section of the window (7d) in the broken line shown in FIG. 15 as a window display. At this time, the section except the window 7d shown by the broken line of the screen (7a) holds the present situation. The range of the scale axis is previously memorized in a memory means in table format.

In the above window (7d) of broken lines, the input range, unit, warning set value as well as the range of scale axis are displayed respectively at the location corresponding to displaying content by the instruction of each mode.

Next, in operating the cursor key (6a) (step ST4), movement of the cursor pointing the range of plural scale axes is performed (step ST5).

Figure 17A:
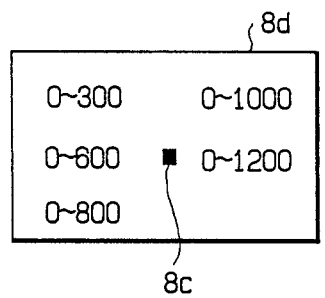

As shown in FIG. 17(a) pointed by cursor (7c), for example, the situation coming under the range of scale of 0 through 1200 is stored at the predetermined area in the RAM (5d) (step ST7). The above operation repeats as long as the ENT key (6c), FCN key (6b) are ON and when the ENT key (6c) and FCN key (6b) are ON, the range of scale axis is registered in the pointed channels (CH)9. Namely, the data of scale range (0 through 1200) of analog signals input from the channel 9 is registered (memorized) at a designated area in the RAM(4d) (step ST8). The above process is repeated as long as the parameters such as the registering time, unit of data, warning set value are set (set 9).

When the input range, scale range, time unit, warning set value, etc. are set, as shown in FIG. 14, the parameters of measuring condition which are registered are displayed on the screen (7a). In this case, the content displayed in the broken line may be displayed at the space of the under part of the screen (7a) (parameter, block display).

Figure 17B:
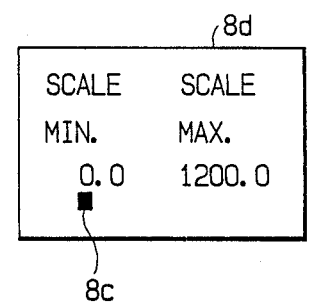

Since the above parameters are set by the instruction of the cursor according to the previously determined value, these parameters are permitted to be displayed in the window (7d), as shown in FIG. 17(b), to move a cursor key (6a3), (6a4) so that the numerals are set to the prescribed value by pressing cursor keys (6a1), (6a2).

The display of mode such as input range, scale range, unit time, etc., may be desirably displayed at any time. When the scale range, the unit, the measuring time, etc. are registered, the instrument performs the trend display by a process to provide the display shown in FIG. 16. This process is as follows.

At first, the analog measured signals which are sampled by control signals from the processing section (5b) at regular intervals are converted into digital signals by the A/D converter (3) and the converted digital signals are taken through the I/O port (5a). The output digital signals are processed by operations for linearizing, scaling or dimension. The processed measured data is stored in the designated area of the RAM(5d).

The above operation continues as long as the measured analog signals input from all of the prescribed channels are converted into digital signals and memorized into the prescribed area (memory means) of the RAM(5d). Next, the data stored in the RAM(5d) is processed for display on the CRT. In case the trend format is set, the data stored in the RAM(5d) is processed for display in the trend format. As is shown in the screen (7a) of FIG. 16, the screen is set so that the full scale of the horizontal axis is three times as large.

Furthermore, for example, when the dimension of the measured value is temperature, the screen is set so that full scale is at 1200° C. according to the measured value. The processed data is processed to store in the designated place of the image memory as display data for display on the screen.

The data stored in the image memory is transferred to a screen memory through the I/O port (5a) and converted into color video signals to display on the display unit (7) in the trend format. Then the above operation is repeated to store the display data of one screen (for example, the data from the present time to the past of three times earlier) into the image memory and the display data is displayed on the screen as the trend format.

After passing further time, the measured data memorized in the image memory three times earlier is cleared to extinguish the screen and the new displaying data of the present is memorized in the image memory. This new displaying data is displayed on the screen. Accordingly, the measured data of a predetermined time (for example three times) is displayed in trend format in correspondence to analog signals.

Figure 16:
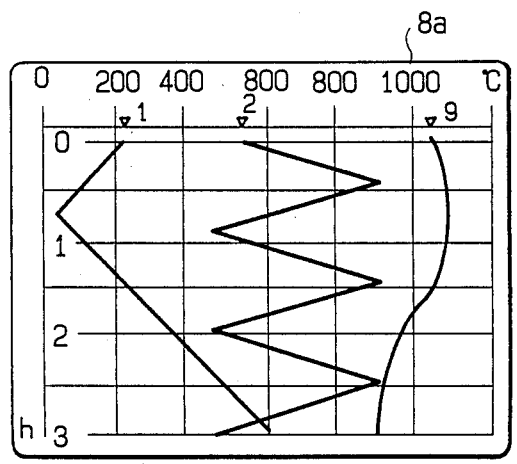

This trend display, as shown in FIG. 16, is shown as a plurality of changing curves or digital display, which is similar to a conventional method of recording on a recording paper. The data before the predetermined time mentioned above is memorized in a memory or an external memory (floppy disk, etc.) and reproduced on the screen by reading out from the memory.

Next, an explanation will be given of another embodiment of the invention.

Figure 18:
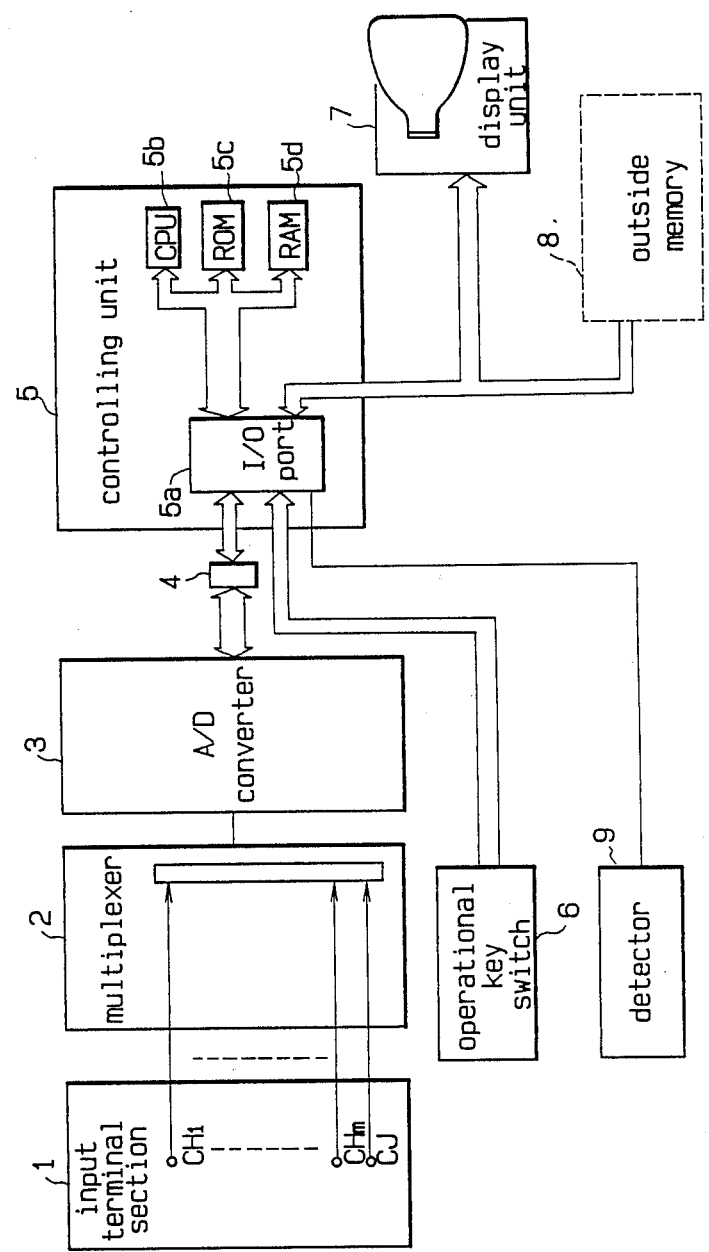
FIG. 18 is a block diagram of a measuring instrument embodying the invention.
Figure 19:
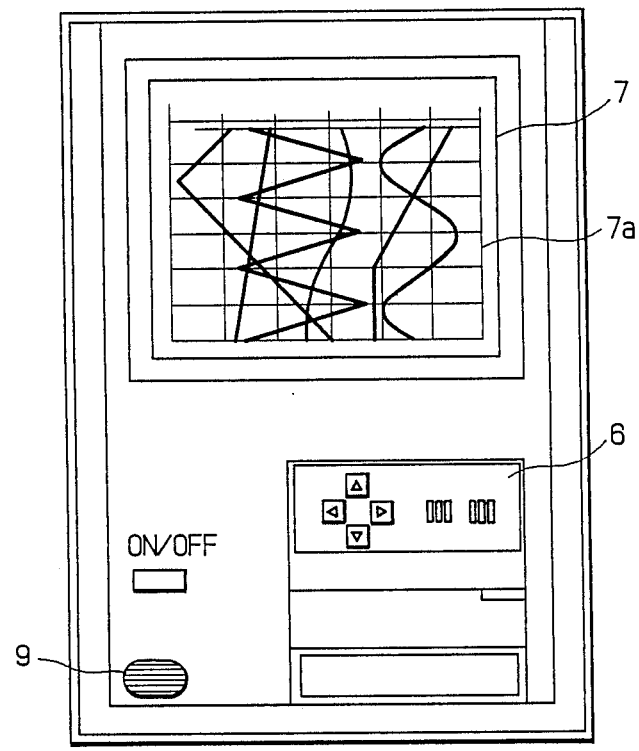
FIG. 19 is a front view of the above measuring instrument.
Figure 20:
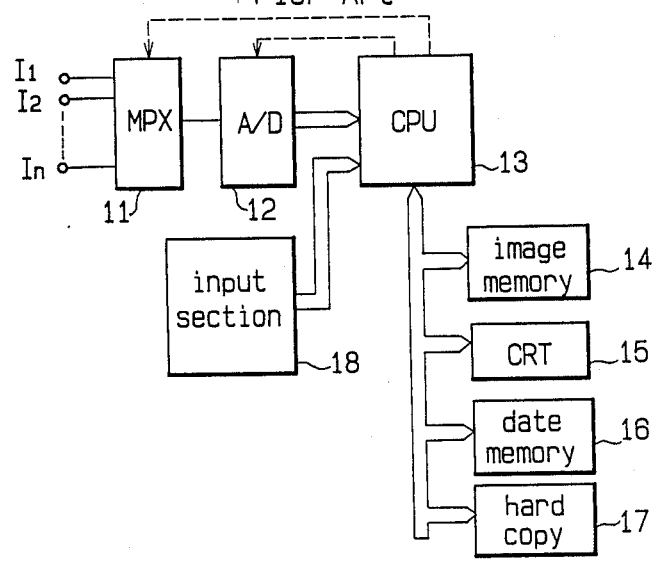
FIG. 20 is a block diagram of an example of a conventional measuring instrument.
Figure 21:
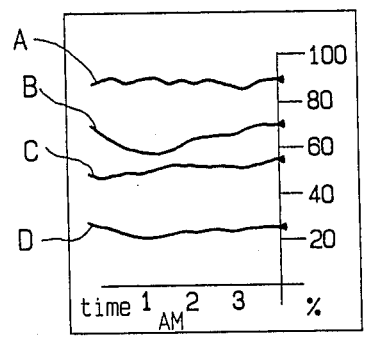
FIG. 21 is a view showing an example of the display format of a conventional measuring instrument.

FIG. 18 shows an embodiment of the invention. As shown in FIG. 18, a detecting device (9) is provided, which outputs signals to set the displaying unit (7) in displaying condition when the user approaches the controlling unit (5). The detecting device (9) is provided at the front panel of the measuring instrument.

In operation, when the detecting device (9) detects an approaching body, the controlling unit (5) sets the screen (7a) of the displaying unit (7) in displaying conditions according to the detecting signals coming from the detecting device. At this time, the screen (7a) of the displaying unit (7) is set in displaying condition unless the power switch is OFF.

On the other hand, when the detecting device does not detect the approaching body, the controlling unit (5) outputs controlling signals to extinguish the screen (7a). Accordingly, the screen is set in extinguishing condition even if the power switch is ON.

Therefore, when the observer moves away from the place (near the measuring instrument), the screen (7a) of the display unit (7) is extinguished, that is, the screen (7a) is extinguished automatically when the user does not observe the screen.

The screen (7a) is set in displaying condition when the detecting device (9) detects an approaching body even if the screen is not in displaying condition. In this case, the devices other than the displaying unit (7) operate normally. For example, even if the screen (7a) is extinguished, the input signals of analog data are stored in a second memory for displaying in trend or digital format. The recording data during the above time can be displayed on the screen at any time.

In the above statement the detecting means (9) can be replaced by other sensors such as an ultrasonic wave sensor and the displaying means may be replaced with a plasma display unit or the like, not restricting the CRT display.

As described above, the invention has a detecting means that detects an approaching body and outputs signals to set the screen in displaying or not displaying mode so that the screen can be automatically extinguished when the observer leaves, resulting in the long life of the measuring instrument and the drop of the power consumption of the instrument.

In case the display unit is CRT, the above effect is great.

The instrument of the invention can memorize the measured data even if the data is not displayed on the screen by using an external memory and reproduce the required screen in short time according to the memorized data.

In this invention, the screen information is obtained immediately without the complication of switching operation of the operator.

The invention can apply to a process control regulating instrument employing the measuring instrument as described above.

While a preferred embodiment of the invention has been described using specific terms, such description is for illustrative purpose only, and it is to be understood that changes and variations may be made without departing from the spirit and scope of the following claims.

What is claimed is:

1. A measuring instrument for converting a plurality of physical values into prescribed units for comparing physical values obtained as a result of measurements, and displaying the same, comprising:
   a display unit having a screen;
   a trend format display controlling section having a video memory for storing screen information and connected to memorize the trend format screen at a plurality of memory areas designated by a series of addresses corresponding to each scanning line of the display screen, a data memory for storing information of measured data for displaying the measured data, and means for producing on the screen of the display unit a screen simulating a recording paper moving at said given speed by sequentially changing the address of said video memory when retrieving the information following one screen after taking out the information of one screen by accessing the content in the video memory;
   a matrix table format display controlling section for processing the measured data to memorize at the data memory and to display each of the measured data of each channel on the screen as digital numerals in table format as a matrix formed of each channel and each time;
   a switching section connected to change the display format displayed by the trend format display controlling section and the matrix table format display controlling section by switching the content of the video memory and the content of the data memory; and
   a display screen controlling section having means to display a cursor on the screen of the trend format controlled by the trend format display controlling section so that the cursor can be moved in the axial direction for indicating time, and means to change the display for displaying a plurality of measured data at the specific time designated by the cursor on the screen in the table format under control of the matrix table format display controlling section.

2. A measuring instrument for converting a plurality of physical values into prescribed units for comparing the physical values obtained as a result of measurement and displaying the same, comprising:
   a display unit having a screen;
   a trend format display controlling section having a video memory for storing screen information to memorize the trend format screen at a plurality of memory areas designated by a series of addresses corresponding to each scanning line of the display screen, a trend line in the screen continuing in a direction perpendicular to a scanning direction, a data memory for storing information of measured data for displaying the measured data, and means for producing a screen simulating a recording paper moving at said given speed so that the trend line in the screen continues in a direction perpendicular to the scanning direction by sequentially changing the address of said video memory when reading out the information following one screen after reading out the information of one screen by accessing the content of the video memory; and
   a changing section for regulating the thickness of a line of the measured data displayed on the screen by changing the number of dots aligned along the scanning direction of the trend format when the trend format display controlling section displays dots on the screen to display a condition similar to a display of measured data by the recording paper based on the data of the trend format display controlling section.

3. A measuring instrument for converting a plurality of physical values into prescribed units for comparing the physical values obtained as a result of measurement and displaying the same, comprising:
   a display unit having a screen;
   a trend format display controlling section having a video memory for storing screen information to memorize the trend format screen at a plurality of memory areas designated by a series of addresses corresponding to each scanning line of the display screen, a data memory for storing information of measured data for displaying the measured data, and means for producing a screen that simulates a recording paper moving at a given speed by sequentially changing the address of the video memory when reading out the information following one screen after reading out the information of one screen by accessing the content in the video memory; and
   an abnormal information adding section for detecting abnormal conditions of the measured data and adding an indication of the detection of the abnormal information to the measured data in the trend format when the trend format display controlling section displays the measured data in the trend format, abnormal information being displayed by a line at the side of the screen and along the abnormal information.

4. A measuring instrument for converting a plurality of physical values into prescribed units for comparing the physical values obtained as a result of measurement and displaying the same simultaneously at a plurality of channels, comprising:
- a display unit having a screen;
- a trend format display controlling section having a video memory for storing screen information to memorize the trend format screen at a plurality of memory areas designated by a series of addresses corresponding to each scanning line of the display screen, a data memory for storing information of measured data for displaying the measured data, and means for producing a screen that simulates a recording paper moving at a given speed by sequentially changing the address of the video memory when reading out the information following one screen after reading out the information of one screen by accessing the content in the video memory; and
- a measured data reproduction display controlling section for processing in case a plurality of data is input in one scanning line of the screen, said measured data reproduction display controlling section calculating maximum and minimum data displayed on one scanning line as dots and storing two data when the trend format display controlling section displays a plurality of measured data as dots on the same line, and reproducing the measured data by drawing a line between two dots representing the above two data.

5. A measuring instrument for converting a plurality of physical values into prescribed units for comparing the physical values obtained as a result of measurement and displaying the same, comprising:
- a display unit having a screen;
- means for selecting parameters for displaying measured data;
- a trend format display controlling section having a video memory for storing screen information to memorize the trend format screen at a plurality of memory areas designated by a series of addresses corresponding to each scanning line of the display screen, a data memory for storing information of measured data for displaying the measured data, and means for producing a screen simulating a recording paper moving at the given speed by sequentially changing the address of the video memory when reading out the information following one screen after reading out the information of one screen by accessing the contents of the video memory;
- means for memorizing a plurality of parameters and processed measured data,
- a processing section connected to display a plurality of parameters in a table style on the screen, said processing section, when parameters are selected from the table by the selecting means, displaying a plurality of parameters relative to the selected parameters on a part of the screen at a window style, and registering, when a parameter is finally selected from the parameters displayed in the window, the selected parameters to the memorizing means, and providing output after processing the measured data according to the registered parameters; and
- means for memorizing data for processing at the processing section.

6. A measuring instrument for converting a plurality of physical values into prescribed units for comparing the physical values obtained as a result of measurement and displaying the same, comprising:
- a display unit having a screen;
- a trend format display controlling section having a video memory for storing screen information all the time regardless of the on and off conditions of the screen to memorize the trend format screen at a plurality of memory areas designated by a series of addresses corresponding to each scanning line of the display screen, a data memory for storing information of measured data for displaying the measured data all the time regardless of the on and off conditions of the screen, and means for producing a screen simulating a recording paper moving at the given speed by sequentially changing the address when retrieving the information following one screen after reading out the information of one screen by accessing the content in the video memory, said means being able to display on the screen data at the time that the display unit is off;
- detecting means for detecting the presence of a human body at a side of the screen; and
- controlling means for transmitting signals to make the displaying condition of the screen when detecting the body by the detecting means and transmitting signals to turn off the screen when detecting no human body.

* * * * *